(12) United States Patent
Detmers

(10) Patent No.: US 7,280,132 B2
(45) Date of Patent: Oct. 9, 2007

(54) METHOD AND DEVICE FOR IMAGING A PRINTING FORM

(75) Inventor: Andreas Detmers, Heddesheim (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 659 days.

(21) Appl. No.: 10/730,458

(22) Filed: Dec. 8, 2003

(65) Prior Publication Data

US 2004/0126169 A1   Jul. 1, 2004

(30) Foreign Application Priority Data

Dec. 9, 2002   (DE)   ................. 102 57 378

(51) Int. Cl.
*B41J 2/47* (2006.01)
(52) U.S. Cl. .................................. 347/253
(58) Field of Classification Search ............... 347/131, 347/132, 237, 240, 247, 251–254, 139; 101/453; 358/1.1, 3.02, 296, 302, 452, 465, 466

See application file for complete search history.

(56) References Cited

U.S. PATENT DOCUMENTS

| | | | | |
|---|---|---|---|---|
| 4,661,861 A | * | 4/1987 | Rutherford et al. | 358/302 |
| 4,878,068 A | * | 10/1989 | Suzuki | 347/253 |
| 5,270,827 A | * | 12/1993 | Kobayashi et al. | 358/3.02 |
| 5,412,408 A | * | 5/1995 | Itoh et al. | 347/132 |
| 5,450,208 A | * | 9/1995 | Murata | 358/296 |
| 5,493,324 A | * | 2/1996 | Goto et al. | 347/252 |
| 5,946,021 A | * | 8/1999 | Kawata | 347/237 |
| 6,075,614 A | * | 6/2000 | Ohtsuka et al. | 358/1.1 |
| 6,341,559 B1 | * | 1/2002 | Riepenhoff et al. | 101/453 |
| 6,417,876 B1 | * | 7/2002 | Nakajima et al. | 347/131 |
| 6,836,282 B2 | | 12/2004 | Vosseler et al. | |
| 2002/0005890 A1 | | 1/2002 | Beier et al. | |
| 2002/0044196 A1 | | 4/2002 | Vosseler et al. | 347/247 |

FOREIGN PATENT DOCUMENTS

| | | |
|---|---|---|
| DE | 100 31 915 A1 | 1/2002 |
| DE | 1176545 | 1/2002 |
| EP | 0 734 151 A1 | 9/1996 |
| EP | 0922573 | 6/1999 |
| EP | 1 176 545 A2 | 1/2002 |

* cited by examiner

*Primary Examiner*—Hai Pham
(74) *Attorney, Agent, or Firm*—Davidson, Davidson & Kappel, LLC

(57) ABSTRACT

A method for imaging a printing form (10) using at least one controllable light source (42) is described, a number of image spots (20) being generated at a number of positions on the printing form (10) in accordance with image data in a bit field, by the controlled action of light on the printing form (10), the intensity of the light acting at at least one of the positions of the image spots (18) being controlled as a function of the value of a measure for the number of the image spots (24) to be generated in one surrounding area (22) of the position. The method may be implemented in a device for imaging a printing form (10), having at least one controllable light source (42) and a control unit (50) including a processor (52) and a memory unit (54) in such a way that a program for executing the method is stored in the memory unit (54) and may be executed in the processor (54). The device may be used in a print unit (58) of a printing press (60).

10 Claims, 4 Drawing Sheets

METHOD AND DEVICE FOR IMAGING A PRINTING FORM

Priority to German Patent Application No. 102 57 378.6, filed Dec. 9, 2002 and hereby incorporated by reference herein, is claimed.

BACKGROUND INFORMATION

The present invention is directed to a method for imaging a printing form using at least one controllable light source, a number of image spots being generated at a number of positions on the printing form in accordance with image data in a bit field, by the controlled action of light on the printing form. The present invention is also directed to a device for imaging a printing form, having at least one controllable light source and a control unit including a processor and a memory unit.

When imaging printing forms, printing-form precursors and printing plates in a print unit of a printing press, errors can arise due to unintentional relative motion, in particular vibrations, between the imaging device and the printing form, the printing form being accommodated, in particular, on a cylinder or constituting the surface area of a cylinder. This unintentional relative motion is caused, for example, by vibrations, by kineostatic deformations of the side frames, or by bearing inaccuracies. An error resulting therefrom is particularly evident in solid areas, in the form of small, narrow, unimaged hairlines (setting lines) between two adjacent imaged lines of image spots that can be produced, in particular, by light from two different light sources. In other words, the actual spacing of adjacent lines of image spots can deviate from the nominal spacing.

Practical approaches for taking constructional or mechanical steps to reduce the unintentional relative motion are often relatively complex and are associated with substantial costs: One step can entail, for example, uncoupling individual machine elements, such as the inking system, or in the case of sheet-processing printing presses, the feeder or the delivery unit, or even the complete press, from a cylinder provided with an individual drive and bearing the printing form. Another step can involve optimizing the mechanics necessary for the imaging device with respect to vibrational response, for example by providing a high degree of stiffness, substantial damping action, or a low weight. However, because of the often broadband vibrational spectrum and the small tolerable amplitudes, all unintentional relative motion is not able to be reliably avoided or eliminated in this way by shifting natural frequencies to higher frequencies. Also, such measures cannot compensate for kineostatic deformations or bearing inaccuracies.

Another approach for avoiding hairlines can provide for imaging using such large image spots that adjacent lines of image spots partially overlap. In the case of an (inadvertent) variation in the spacing of adjacent lines of image spots, which is small in comparison to the diameter of the image spots, the fact that they either still overlap one another or directly border on one another has the effect that no hairline is visible, in spite of (inadvertent) relative motion. However, when imaging using, in principle, larger image spots, this leads to limitations in the sparse regions in the printing image, thus in regions having low area coverage. In particular, gradations can then no longer be uniformly resolved.

From European Patent Application No. 1 176 545 A2, hereby incorporated by reference herein, it is known that images can be recorded on a printing form using at least one light source, the size of the image spots being variable. A number of image spots is produced at a number of positions on the printing form in accordance with image data in a bit field. The active spot size of the light beam striking the printing form surface, thus the area where the intensity exceeds the threshold for recording images on the printing form, is modifiable by varying the power of the light source (input power or optical power) or by varying the exposure time. The size of the image spots is changed as a function of the distance of the light source from the surface of the printing form. An increase in the energy introduced into the printing form leads to an enlargement of the image spot.

European Patent Document No. 0 734 151 B1, hereby incorporated by reference herein, describes a size-modulated, stochastic, rastered screening process. Raster points (halftone dots) are made up of a number of micro-dots or recorder elements (image spots). Micro-dots are the smallest addressable unit. From the raster points, raster areas are formed. The size of a particular raster point is modulated by varying the number of micro-dots as a function of the number of raster points surrounding the particular raster point.

BRIEF SUMMARY OF THE INVENTION

An object of the present invention is to enable a printing form to be imaged in a way that will reduce the occurrence of visible hairlines on the imaged printing form or in the print image without having to accept limitations in the regions having low area coverage.

In accordance with the present invention, in a method for imaging a printing form using at least one controllable light source, a number of image spots is generated at a number of positions on the printing form in accordance with image data in a bit field, by the controlled action of light on the printing form. The intensity of the light acting at at least one of the image spot positions is controlled as a function of the value of a measure for the number of image spots to be generated in one surrounding area of the position. The light source may be, in particular, a laser light source, for example a solid-state laser or semiconductor laser, preferably a diode laser. A plurality of light sources may be used temporally and/or spatially in parallel to produce a plurality of image spots. The image spots represent the smallest addressable unit for the imaging. From image spots, raster points, fulltone areas or the like may be constructed. The printing form may be flat or curved. In particular, the printing form may be plate-shaped or sleeve-shaped.

The method of the present invention advantageously improves the imaging result by controlling or regulating the light source power as a function of image data, area coverage, or as a function of the raster. The errors in the imaging result, in particular the above-described hairlines, caused by unintentional relative motion, in particular vibrations, are made invisible by increasing the intensity of the light impinging on the printing form, thereby enlarging the point diameter, and thus the image spot. The intensity may be changed, in particular, by varying the focusing of the light or (preferably) by varying the output power of the light source. A diode laser may be used, for example, to vary the pump current, thus the input power of the light source, to change the optical power. As an alternative to varying the intensity, it is also possible to vary the exposure time. Variations both in the intensity, as well as in the exposure time influence the energy input into the image spot.

As already mentioned, for solid areas, it is possible to enlarge the image spot without adversely affecting the print image. The less dense the area coverage is in one region or in one partial area of a printing form, the more critical it is to compensate for an imperfect position (hairline) by enlarging the image spot. For this reason, the spot size is controlled in dependence upon or as a function of the image data. Depending on the area coverage, the spot size may be reduced or increased: For solid areas, maximum enlargement is required, for low area coverage, correspondingly less. The degree of enlargement required depends on parameters that influence undesired relative motion. The region or the surrounding area where the surround-field consideration is carried out may advantageously be selected to be small enough to enable an assessment to be made as to whether the particular region or surrounding area already constitutes a solid area. In other words, a large region may be considered to include a number of small surrounding areas, so that the large region does, in fact, have a low area coverage, but small surrounding areas also have high density area coverages or are solid areas.

The quantification of how dense an imaging will be or is in the surrounding area of the considered position serves as the mentioned measure for the number of image spots to be generated in one surrounding area. In particular, a criterion may be provided in the form of a limiting value, specifying from when on the surrounding area will represent an area having a high degree of area coverage or a solid area. As described above, it is precisely in those areas that occurring hairlines are visible, so that, in the method of the present invention, the intensity used to generate image spots is effectively increased. One specific embodiment of the method according to the present invention for imaging a printing form provides for increasing the intensity in response to exceedance of a limiting value of the measure. Below the limiting value, the imaging operation may be carried out with a planned intensity appropriate for the material of the printing form and necessary for achieving a desired size of the image spots.

When the amplitude of the unintentional relative motion, in particular vibration, is known, for example by direct or indirect measurement, or by calculation, it is advantageously provided in one specific embodiment of the method according to the present invention for imaging a printing form, for the intensity to be increased in such a way that the diameter of the generated printing dot is increased by a magnitude that is proportional to an amplitude of a relative motion, in particular vibration, between the projection point and the printing form. For one skilled in the art, it is clear that the magnitude may also be selected to be proportional to an amplitude of a relative motion between the light source and the printing form. The limiting value may lie within the interval of between 85% and 75% of the maximum value of the measure, it may preferably be 80%.

In the case of one imaging device in a print unit, typical amplitudes of the unintentional relative motion between projection points of the light or of the light source and the printing form are on the order of 5 micrometers. A typical dot size of an image spot on the printing form is 11 to 13 micrometers, given a spacing between nearest neighbors of approximately 10 micrometers. Therefore, to compensate for occurring hairlines, each spot size needs to be increased by 2 to 4 micrometers.

The surrounding area of an image spot position, where the surrounding field or vicinity of the image spot position is considered, may have any desired suitable form, in particular it may be circular, rectangular, or square. It forms a minimum area, may be one-dimensional or, preferably, two-dimensional. In advantageous embodiments of the method, the surrounding area may either be made up of the image spot positions directly adjacent to the position, or be a raster point, or a partial area of the printing form. The extent or size of the surrounding area (for a circle, the diameter, for a rectangle, the lengths of the sides) is selected in a way that permits an assessment to be made as to whether hairlines may become disturbingly visible or not.

At this point, it is emphasized that each raster point, which is composed of a plurality of image spots, may be understood to be a small solid area: for each position of an image spot, one surrounding area, made up of the four positions of image spots directly adjacent to the position, is selected, so that an assessment may be made as to whether the limiting value of the measure for the number of image spots to be generated, here, for example, the number being three of the image spots, is exceeded. In such a case, the intensity may be increased by the amount necessary to make the diameter of the image spots large enough for the hairlines to be hidden by sufficient overlapping. It should be noted that, in this approach, the raster point is not enlarged, since the measure of the surrounding areas of the fringe spots does not exceed the limiting value.

In one specific embodiment of the method, the measure may be the number of bits set in the bit field. In another alternative embodiment, the measure may be the area coverage of the surrounding area.

In connection with the inventive idea, there is also a device for imaging a printing form, having at least one controllable light source and a control unit including a processor and a memory unit. In accordance with the present invention, a program for executing the method delineated in this description, is stored in the memory unit. In other words, the program has at least one part, which, during execution in the processor, carries out a method for imaging a printing form or an embodiment of this method in accordance with this description.

In one advantageous embodiment of the device for imaging a printing form, a characteristic (table, look-up table or the like) is stored in the memory unit that describes the dependency of the laser power on the measure for the number of image spots to be generated in one surrounding area. In dependence upon the result of the surround-field consideration in the surrounding area of one position of an image spot, on the basis of this characteristic, the laser power necessary for the intensity required to generate a size-modified image spot may be allocated for driving the light source.

In one preferred embodiment, the device of the present invention has a number of light sources in the form of at least one laser diode bar having a number of individually drivable laser diodes essentially arranged in a series.

The device of the present invention may be advantageously used in a printing-form exposure device or printing-plate exposure device.

The device of the present invention may be integrated or accommodated in a print unit. The print unit according to the present invention includes at least one imaging device, as set forth in this description. In particular, the print unit may be a direct or indirect planographic print unit, a wet offset print unit, a dry offset print unit, or the like. A printing press according to the present invention has at least one print unit according to the present invention. The printing press may be a sheet-processing or web-processing press. Typical printing materials are paper, board, cardboard, organic polymers (in the form of fabric, foils, or workpieces) or the like. A sheet-processing printing press may have a feeder, a delivery unit, and, in some instances, also at least one surface-finishing unit (coating unit, punching unit, creasing unit or the like). A web-processing printing press may include a reelchanging unit, a dryer, and a folder.

BRIEF DESCRIPTION OF THE DRAWINGS

Further advantages, advantageous specific embodiments and refinements of the present invention are described on the basis of the following figures as well as their descriptions. In particular.

DETAILED DESCRIPTION

Figure 1:
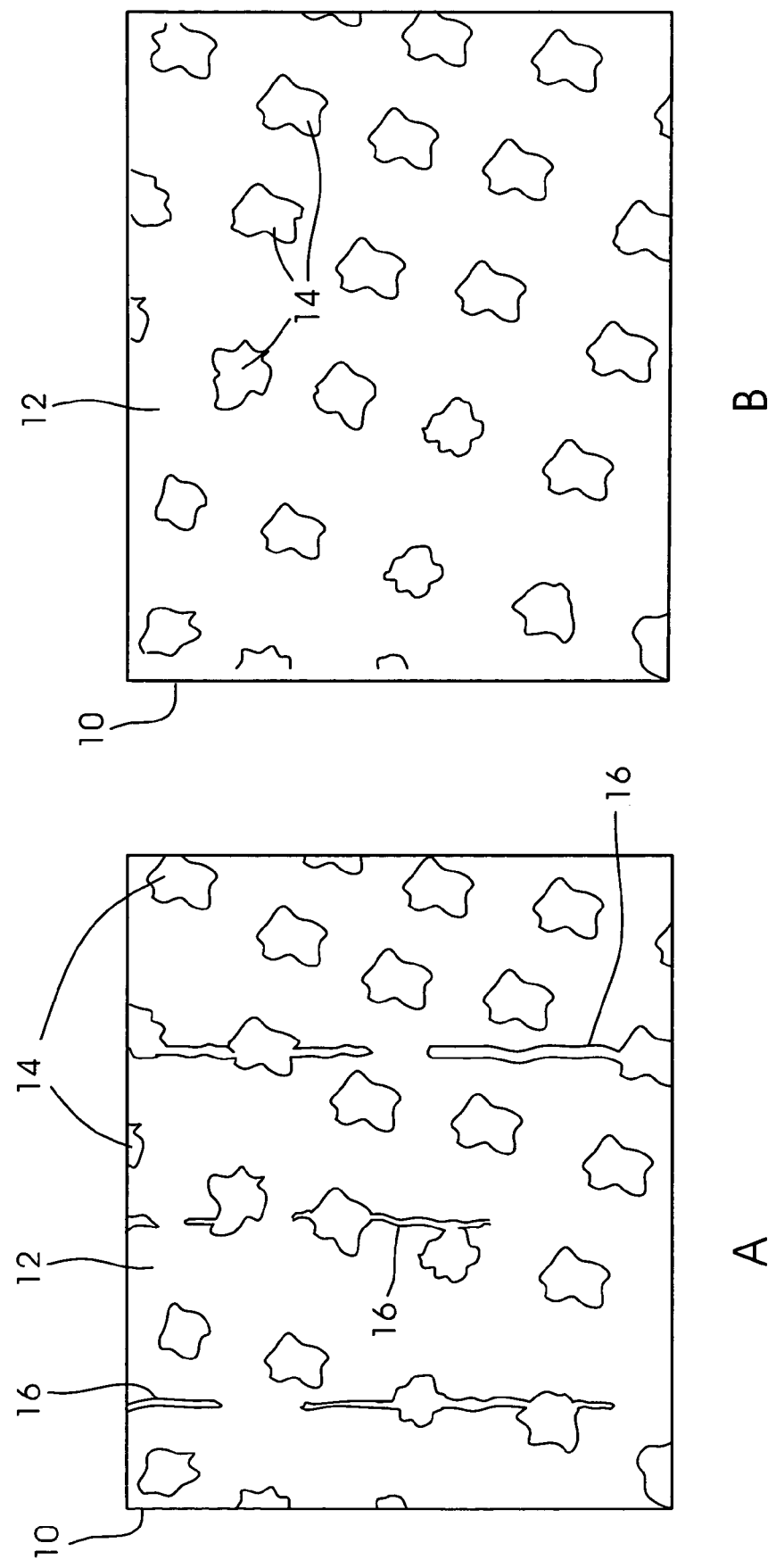
FIG. 1 shows in partial image A, schematically an imaged surface area of a printing form, including hairlines, and, in partial image B, schematically a surface area of a printing form imaged using the method of the present invention.

In partial image A, FIG. 1 schematically shows an imaged surface area of a printing form, including hairlines, and, in partial image B, a surface area of a printing form imaged using the method of the present invention. The purpose of the figure is to make clear the difficulty that occurs in a conventional imaging operation.

In a conventional imaging operation, as shown in partial image A, image spots are imaged using a constant intensity. Here, an enlarged raster area of a printing form 10 is shown that is provided with an amplitude-modulated rastered screening: In an imaged area 12, the enlarged raster area has a number of unimaged partial areas 14. Due to the coaction of the imaged and unimaged portions, an observer of the printing form 10 or of a print of printing form 10, perceives the raster area as a brightened area in comparison to the solid area. Due to the unintentional relative motion described above, hairlines 16, which can be visible to an observer, occur in the raster area of printing form 10. Generally, hairlines 16 are not evenly spaced apart, since the periodicity of the unintentional relative motion is not necessarily a multiple of the periodicity of the imaging timing used for setting the individual image spots.

In partial image B, the result of an imaging in accordance with the method of the present invention is shown. In one imaged area 12, the enlarged raster area of printing form 10 has a number of unimaged partial areas 14, due to the coaction of the imaged and unimaged portions, an observer perceiving the raster area as a brightened area in comparison to the solid area. Using the surround-field consideration delineated in this description, in the surrounding areas of the positions of the number of image spots, it is ascertained whether an imaging is to be undertaken at a modified, in particular, increased intensity. For positions inside imaged area 12, it follows from such a surround-field consideration in accordance with the present invention, that the intensity may be increased, in order to generate larger image spots, thereby enabling hairlines to be hidden. For positions inside unimaged partial areas 14, no change in intensity is necessary. For positions at the fringes of imaged area 12, it follows from a surround-field consideration that no change in intensity needs to be made. When these image spots are set in an unaltered size, the unimaged partial areas are substantially unchanged, preferably not changed at all, so that the brightness of the raster area is substantially unchanged, preferably completely unchanged.

It should be mentioned at this point that, alternatively to an amplitude-modulated rastered screening (AM raster), a frequency-modulated rastered screening (FM raster) may be imaged in the method of the present invention.

Figure 2:
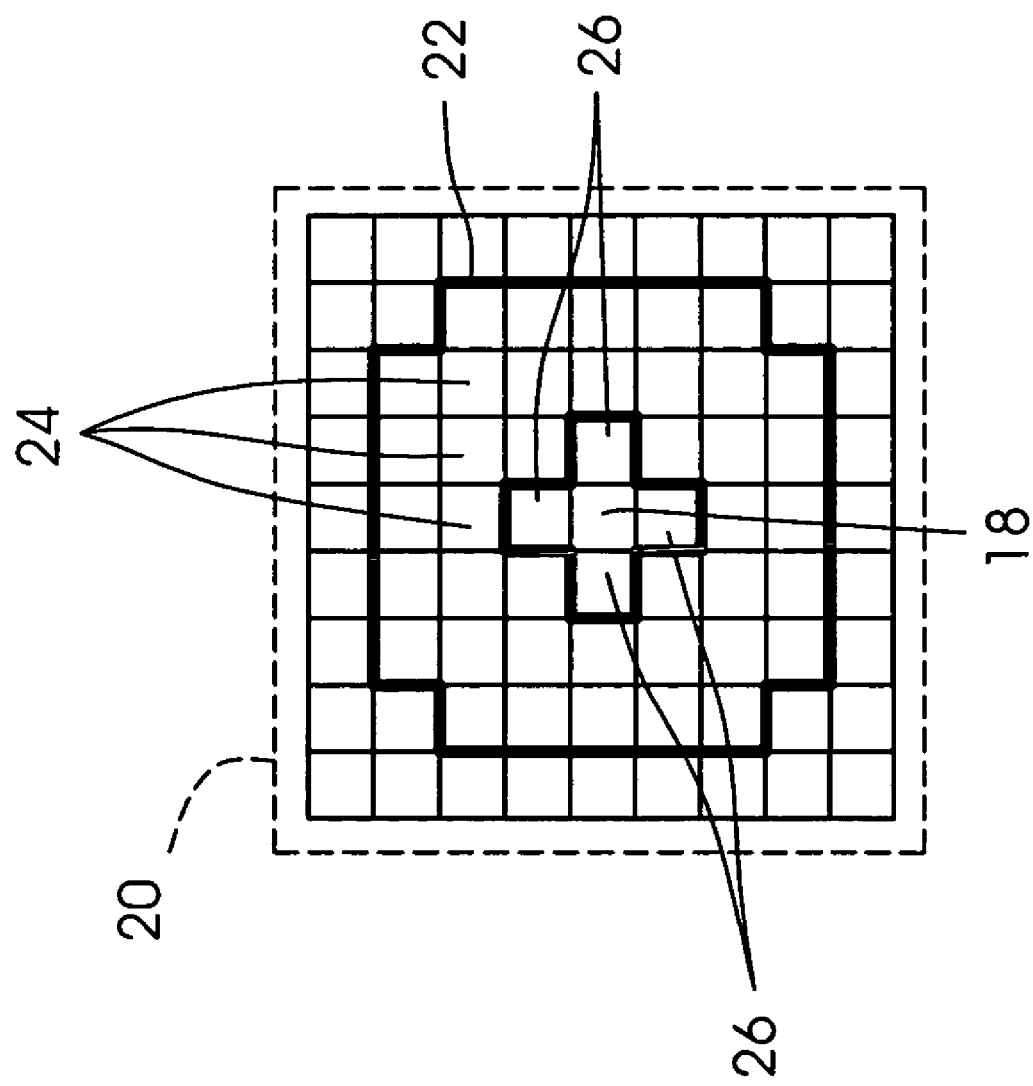
FIG. 2 shows schematically, a group of image spots around a position, including a surrounding area, to elucidate the concepts introduced herein.

To clarify the concepts introduced here, FIG. 2 schematically represents a group of image spots around a position 18 having a surrounding area 22. A group of image spots 20 is shown here, arranged, in this embodiment, in a regular Cartesian raster. Image spots 20 may also be set in other (preferably regular) rasters. The general concept underlying the surrounding area analysis is independent of the geometric distribution of the image spots on the printing form. In other words, for the surrounding area analysis, the topological information of the neighborhood of image spots is used, not the geometric information (position, spacing, etc.) of the image spots on the printing form. Thus, it is immediately clear to one skilled in the art that a surround-field consideration may also be carried out in the bit field containing only topological information. The geometry on the printing form plays a role in the ratio of the spacings between adjacent image spots in comparison to the amplitudes of unintentional relative motion, in particular vibrations. In this embodiment, surrounding area 22 lies in a polygon shape around position 18 and contains a set of image spots 24. In this surrounding area 22, a surround-field consideration or surrounding area analysis is undertaken for position 18. In a first embodiment, the number of bits set in the bit field, thus of the image spots in surrounding area 22, may be the measure. In a second embodiment, the measure may be the area coverage of surrounding area 22, i.e., the ratio of the imaged area of image spots 24 to the total area of surrounding area 22.

A solid area exists when all bits are set in the bit field. For the image spots, this means that all will be or are exposed. An area having a high degree of area coverage exists when many bits are set in the bit field. For the image spots, this means that many will be or are exposed. A quantification with respect to and delimitation from areas having low area coverage may be achieved, for example, in the first embodiment by defining a limiting value in the following manner. If the number of image spots to be imaged in the surrounding area is greater than the specific defined limiting value, then considered position 18 lies in an area having a high surface coverage or in a solid area. If the number of image spots to be imaged in the surrounding area is less than or equal to the specific defined limiting value, then the considered position lies in an area having a low area coverage. For the second embodiment, an analogous approach may be used. The surrounding area analysis is carried out for a plurality of, preferably for all positions of the image spots.

On the basis of FIG. 2, reference is made to an advantageous selection of a surrounding area in an alternative embodiment: A surrounding area of position 18 may be made up of only the four directly adjacent image spots 26. Such small surrounding areas make it advantageously possible to directly determine whether position 18 lies on a fringe of an imaged area or not.

Figure 3:
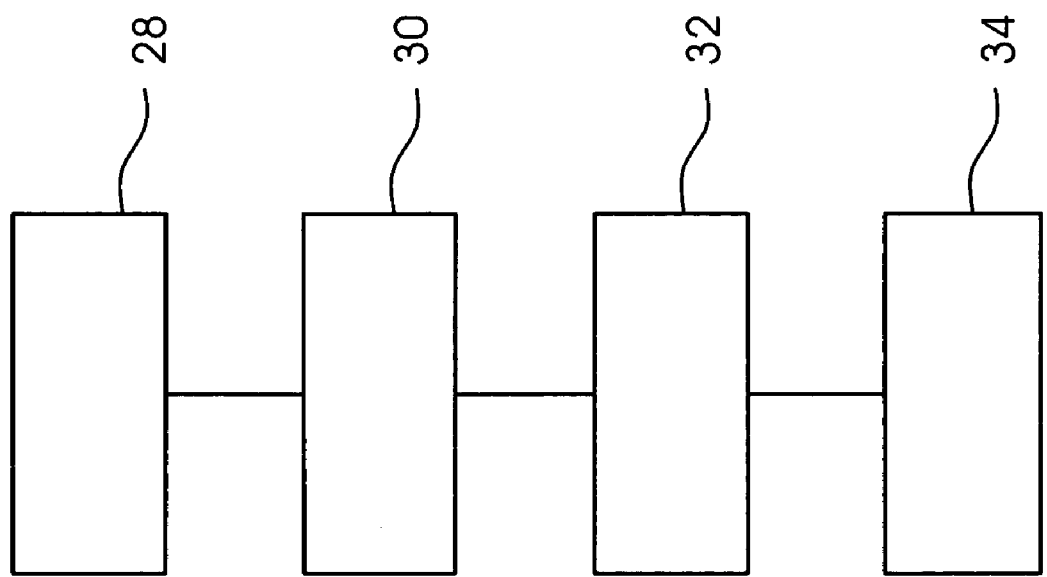
FIG. 3 shows a chronological flow chart of a specific embodiment of the method of the present invention.

FIG. 3 is a chronological flow chart of a specific embodiment of the method of the present invention. In preparatory step 28, a bit field to be printed is fed partially, by sections or in its entirety, to a control unit of an imaging device. In a surrounding area analysis step 30, a number of positions of image spots, equivalent to the positions of bits corresponding to image spots in the bit field ordered in accordance with the nearest neighborhood relations, is subjected to a surround-field analysis (see, in particular, FIG. 2). In an intensity-assignment step 32, the intensity with which the light source used for imaging is to be driven is associated with each position of an image spot of the number of positions. In imaging step 34, the printing form is exposed. This means the image spots are generated on the printing form for each position using a controlled intensity in accordance with the result of the surround-field analysis, thus, in dependence upon or as a function of the value of a measure for the number of image spots to be generated in one surrounding area of the position.

Figure 4:
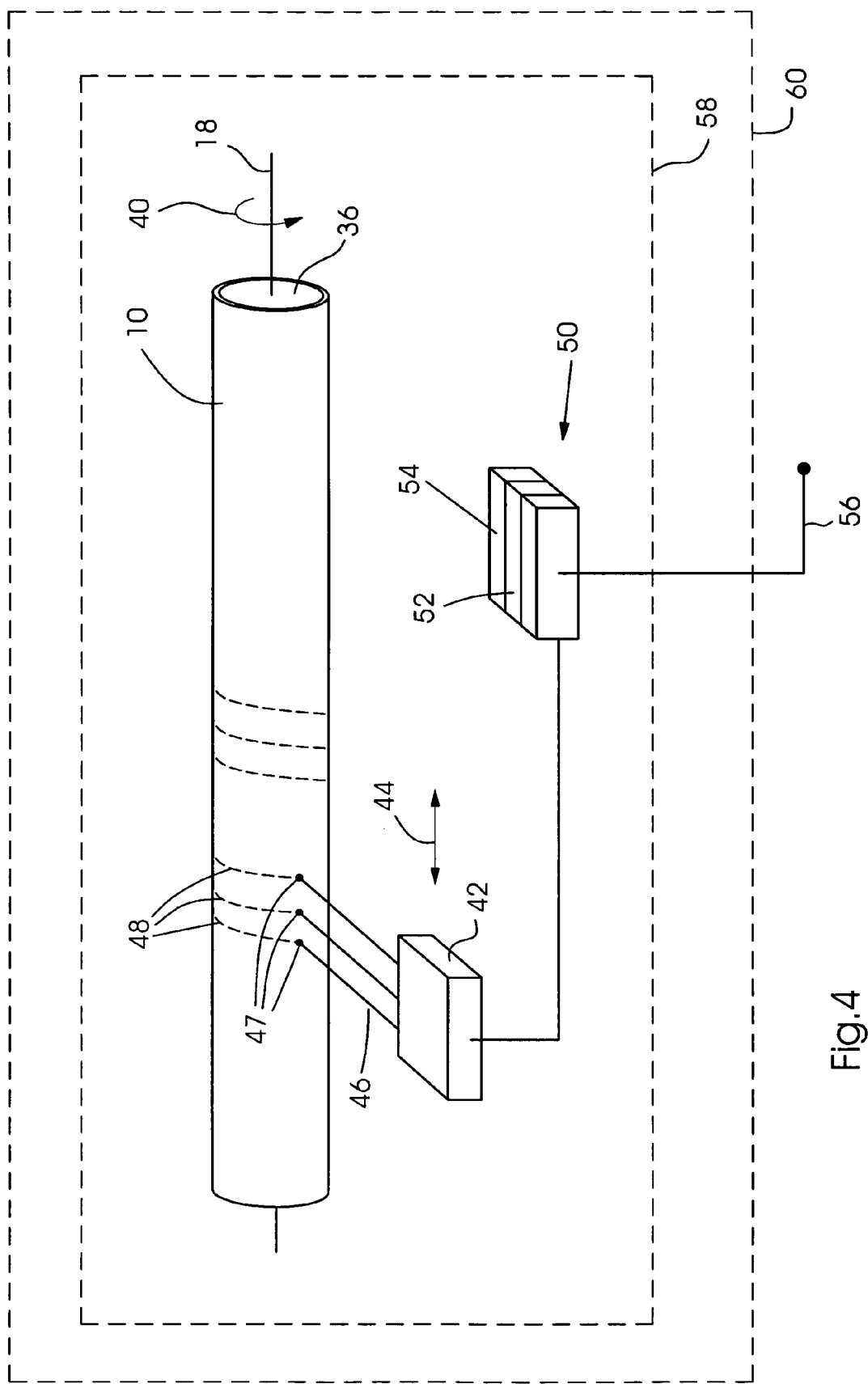
FIG. 4 shows the topology of a specific embodiment of a device according to the present invention for imaging a printing form.

FIG. 4 shows the topology of a specific embodiment of a device according to the present invention for imaging a printing form 10 in a print unit 58 of a printing press 60. The imaging device has a printing form 10, which is accommodated on a printing-form cylinder 36. Printing-form cylinder 36 is rotatable about cylinder axis 38 and accommodated in the print unit (not shown in detail here), and is provided with corresponding drive means. Rotational motion 40 is indicated by an arrow. The device includes a light source 42, here, including a diode laser bar having three individually drivable laser diodes. The preferred emission wavelength is in the near infrared, preferably at 830 nanometers. Light source 42 is essentially movable in parallel to cylinder axis 38 in translational direction 44, indicated by the double arrow, and is provided with corresponding drive means, not shown here in greater detail. Light beams 46 impinge in projection points 47 on the surface of printing form 10. Image spots are able to be generated on printing form 10 by the energy input of the light beams. In the coaction of rotational motion 40 and translational motion 44, projection points 47 of light beams 46 sweep over the two-dimensional surface of the printing form along helical paths 48. The motion is controlled in such a way that the surface of printing form 10 is reached at all points in the later printing surface at least once by one of light beams 46. In particular, an imaging of printing form 10 may be undertaken using an interleave method. Such an interleave method is described in the document DE 100 31 915 A1. Its disclosure is incorporated by reference in this description.

Light source 42 is connected to a control unit 50, so that a driving operation may be carried out in accordance with the image data to be imaged. Signals, which represent at least portions of the image data to be imaged, are transmitted to light source 42, which has light beams 46 lying precisely on the image spots to be imaged along paths 48 of projection points 47. It is immediately clear to one skilled in the art that it is necessary to re-sort the data of a bit field, ordered in accordance with the nearest neighborhood relations, in order to transmit the same to the light source, due to the staggered driving of the image spots in accordance with an interleave method, in particular in accordance with the technical teaching of the document DE 100 31 915 A1. Control unit 50 includes a processor 52 and a memory unit 54. Control unit 50 also has an image-data interface 56, for example a connection to a pre-press apparatus or a peripheral unit for reading a data carrier, which enables the image data to be imaged to be successively transmitted in portions or in their entirety to control unit 50.

A program is stored in memory unit 54 which enables the method described here to be executed, together with the surround-field analysis, in surrounding areas of positions of image spots. In other words, the program has at least one part which, during execution in processor 52, carries out a method for imaging a printing form or an embodiment of this method in accordance with this description.

In one advantageous embodiment, the image data are processed in control unit 50 in a way that enables the surrounding area to be considered for each position in the bit field or in the image, so that the intensity required at this position is determined. It may be provided in an alternative embodiment that only the signals applied directly to the individual diode lasers of the diode laser bar of light source 42—on (1) or off (0)—be checked. A solid area exists when a diode laser receives only a sequence of on signals. In the case of a low area coverage, off signals are also present in the sequence. Thus, the image data may be directly inferred from the analysis of the sequence and the intensity controlled as a function of the image data.

In the context of FIG. 4, it is pointed out that, alternatively to a processing in control unit 50, the surround-field consideration may be carried out in light source 42, which has integrated control components, or in a raster image processor (RIP), which is connected via the image-data interface to the control unit.

REFERENCE SYMBOL LIST 10 printing form
12 imaged area
14 unimaged partial area
16 hairline
18 position of image spot
20 image spots
22 surround
24 image spots inside surround
26 directly adjacent image spot
28 step for preparing a bit field
30 surrounding area analysis step
32 step for assigning the intensity
34 imaging step
36 printing form cylinder
38 cylinder axis
40 rotational motion
42 light source
44 translational motion
46 light beams
47 projection point
48 path of the projection point
50 control unit
52 processor
54 memory unit
56 image data interface
58 print unit
60 printing press

What is claimed is:

1. A method for imaging a printing form using at least one controllable light source, the method comprising the steps of:
   generating a plurality of image spots at a plurality of positions on the printing form in accordance with image data in a bit field by controlled action of light on the printing form; and
   controlling an intensity of the light acting at at least one of the positions of the image spots as a function of a value of a measure for the plurality of the image spots to be generated in a surrounding area of the position; in response to exceedance of a limiting value of the measure, the intensity is increased so that a diameter of a generated printing dot is increased by a magnitude proportional to an amplitude of a relative motion between the projection point and the printing form.

2. The method as recited in claim 1 wherein the surrounding area is either made up of the positions of image spot directly adjacent to the position, or is a raster point, or a partial area of the printing form.

3. The method as recited in claim 1 wherein the measure is a number of bits set in the bit field.

4. The method as recited in claim 1 wherein the measure is an area coverage of the surrounding area.

5. The method as recited in claim 1 wherein the limiting value lies within the interval of between 85% and 75% of a maximum value of the measure.

6. A device for imaging a printing form comprising:
at least one controllable light source; and
a control unit including a processor and a memory unit, wherein a program is stored in the memory unit, the program having at least one executable step for execution in the processor, the at least one executable step carrying out the method for imaging a printing form as recited in claim 1.

7. The device as recited in claim 6 wherein a characteristic describing a dependency of the light intensity on the measure for the plurality of image spots to be generated in one surrounding area is stored in the memory unit.

8. The device as recited in claim 6 wherein at least one controllable light source comprises at least one laser diode bar having a plurality of individually drivable laser diodes arranged serially.

9. A print unit comprising at least one imaging device as recited in claim 6.

10. A printing press comprising at least one print unit as recited in claim 9.

* * * * *